(12) United States Patent
Smith

(10) Patent No.: US 12,284,782 B2
(45) Date of Patent: *Apr. 22, 2025

(54) COOLING ELECTRONIC DEVICES INSTALLED IN A SUBSURFACE ENVIRONMENT

(71) Applicant: David Lane Smith, Bryan, TX (US)

(72) Inventor: David Lane Smith, Bryan, TX (US)

( * ) Notice: Subject to any disclaimer, the term of this patent is extended or adjusted under 35 U.S.C. 154(b) by 318 days.

This patent is subject to a terminal disclaimer.

(21) Appl. No.: 17/893,042

(22) Filed: Aug. 22, 2022

(65) Prior Publication Data

US 2022/0400577 A1 Dec. 15, 2022

Related U.S. Application Data

(63) Continuation-in-part of application No. 16/362,681, filed on Mar. 24, 2019, now Pat. No. 11,421,921, which is a continuation-in-part of application No. 15/457,025, filed on Mar. 13, 2017, now Pat. No. 10,240,845, which is a continuation-in-part of application No. 14/378,261, filed as application No. PCT/US2013/054414 on Aug. 9, 2013, now Pat. No. 9,593,876.

(60) Provisional application No. 61/698,365, filed on Sep. 7, 2012.

(51) Int. Cl.
*H05K 7/20* (2006.01)
*F24T 10/10* (2018.01)

(52) U.S. Cl.
CPC ...... *H05K 7/20236* (2013.01); *H05K 7/20263* (2013.01); *H05K 7/20272* (2013.01); *F24T 10/10* (2018.05)

(58) Field of Classification Search
CPC .. H05K 7/20263; H05K 7/20272; F24F 10/10
See application file for complete search history.

(56) References Cited

U.S. PATENT DOCUMENTS

| | | | | |
|---|---|---|---|---|
| 9,593,876 B2 * | 3/2017 | Smith | ............... | H05K 7/20218 |
| 10,240,845 B2 * | 3/2019 | Smith | ............... | F25D 1/00 |
| 11,421,921 B2 * | 8/2022 | Smith | ............... | H05K 7/20272 |

* cited by examiner

*Primary Examiner* — Larry L Furdge

(57) ABSTRACT

A system and method whereby electronic equipment is cooled, for example a computer system, in a subsurface environment including a containment vessel in at least partial contact with subsurface liquid or solid material. The containment vessel may be disposed in a variety of subsurface environments, including boreholes, man-made excavations, subterranean caves, as well as ponds, lakes, reservoirs, oceans, or other bodies of water. The containment vessel may be installed with a subsurface configuration allowing for human access for maintenance and modification. Cooling is achieved by one or more fluids circulating inside and/or outside the containment vessel, with a variety of configurations of electronic devices disposed within the containment vessel. The circulating fluid(s) may be cooled in place by thermal conduction or by active transfer of the fluid(s) out of the containment vessel to an external heat exchange mechanism, then back into the containment vessel.

22 Claims, 11 Drawing Sheets

COOLING ELECTRONIC DEVICES INSTALLED IN A SUBSURFACE ENVIRONMENT

RELATED APPLICATION

This application is a continuation-in-part of U.S. patent application Ser. No. 16/362,681, filed on Mar. 24, 2019 and entitled "COOLING ELECTRONIC DEVICES INSTALLED IN A SUBSURFACE ENVIRONMENT", now issued as U.S. Pat. No. 11,421,921, issued on Aug. 23, 2022, which is a continuation-in-part of U.S. patent application Ser. No. 15/457,025, filed on Mar. 13, 2017 and entitled "COOLING ELECTRONIC DEVICES INSTALLED IN A SUBSURFACE ENVIRONMENT", now issued as U.S. Pat. No. 10,240,845, issued on Mar. 26, 2019, which is a continuation-in-part of U.S. patent application Ser. No. 14/378,261, filed on Aug. 12, 2014 and entitled "COOLING ELECTRONIC DEVICES INSTALLED IN A SUBSURFACE ENVIRONMENT", now issued as U.S. Pat. No. 9,593,876, issued on Mar. 14, 2017, which is a 371 of PCT/US2013/054414, filed on Aug. 9, 2013 and entitled "APPARATUS AND METHOD FOR GEOTHERMALLY COOLING ELECTRONIC DEVICES INSTALLED IN A SUBSURFACE ENVIRONMENT", which claims the benefit of U.S. Provisional 61/698,365, filed on Sep. 7, 2012 and entitled "GEOTHERMALLY COOLED COMPUTER HARDWARE SYSTEM DESIGNED FOR SUBSURFACE INSTALLATION".

TECHNICAL FIELD

This disclosure relates to a system and method for cooling electronic devices, including but not limited to computer systems, by installing the electronic devices in subsurface environments such as boreholes, excavations, or bodies of water.

BACKGROUND

Large-scale data centers typically house hundreds or thousands of computer systems in high-density configurations (side-by-side racks, with multiple computing nodes per rack) in an above-ground building. Some sources estimate that up to 50% of the electrical power consumption for data centers is dedicated to cooling the environment in which the computer systems operate.

The heat generated by the internal electronic components of computing devices has long been a significant factor determining the overall system design of computer systems. The most common forms of heat dissipation in early personal computer designs were direct physical contact between the heat-generating integrated circuit chip and a heat-conducting mass such as aluminum, and non-turbulent airflow, typically generated by electrical fans, to circulate cool air through a space interior to the computer system housing. In the early large-scale computing systems of the 1940s and 1950s, heat dissipation consisted primarily of ventilation apertures in housings, followed by ambient-air fans and blowers which cooled by forced air convection.

Zelina, in U.S. Pat. No. 3,566,958 (1971), describes a means of thermally coupling heat conductors to integrated circuit chips, though without addressing how to transport the heat contained in the heat-conducting material away from the space surrounding the electrical device. In U.S. Pat. No. 3,648,113 (1972) Rathjen describes a means of stacking planar electronic devices, with spacing between the flat planes, and cooling the entire assembly using fluid flow across the flat surfaces; the cooling fluid exits the entire assembly, thereby transporting heat away from the heat-generating electronics. Austin, in U.S. Pat. No. 3,737,728 (1973) discloses a mounting structure for fragile heat-generating devices (e.g. devices used in computer apparatuses), as well as uniformity of heat conduction and good heat dissipation away from the core assembly area. These ideas are combined in U.S. Pat. No. 3,865,183 (1975), in which Roush describes a more comprehensive means of constructing a full computer assembly with good heat dissipation characteristics of the individual circuit boards in the module, with fluid flow for removal of heat energy from the assembly.

As semiconductor densities in computing devices continued to increase, progressively more heat was generated by the devices. Beginning in the 1980s a series of advancements was made in the heat removal capabilities of computer systems, primarily through the use of liquids. Oktay, in 1980 (U.S. Pat. No. 4,203,129) described the bonding of a heat sink to the surface of a heat-generating electronic device, and immersing the other surfaces of the heat sink in a liquid, which circulates through tunnels in the heat sink material. This innovation was followed by others too numerous to mention by inventor and patent number, including: jacketing the CPU of a computer and placing liquid coolant directly in contact with the CPU jacket, with or without pumps for circulation of the liquid; increasingly complex valves and other electronically controlled redundant cooling components for one or more CPUs or other heat generating electronic components; various designs for the channels and pipes carrying the liquid coolant; closed loop and open loop systems with physical contact between loop housings and varying degrees of fluid exchange between them.

The cooling capacity of the earth's subsurface has long been recognized as a potential energy-saving feature of systems that cool inhabited environments. Because the subsurface maintains essentially a constant temperature at a given depth and the rock and/or artesian mass and volume of the subsurface are vast, heat can be exchanged with either warmer surface fluid, thereby providing cooling, or cooler surface fluid, thereby providing warming. Vignal and Chapuis, in U.S. Pat. No 3,965,694 (1976) describe a means of exchanging heat with the earth's subsurface via a U-shaped line or pipe buried in a deep hole bored in the earth; their design is directed at systems for warming or cooling above-ground air. Many devices since then have been disclosed that improve on various aspects of air-conditioning designs and provide for more efficient heat transfer between above-ground fluids and subsurface rock or liquid.

The use of subsurface thermal capacity to control the operating temperature of electronic equipment was disclosed by Enlund in U.S. Pat. No. 6,397,933 (2002) for equipment installed in a station and by Kidwell and Fraim in U.S. Pat. No. 7,363,769 (2008) for the cooling of electronic equipment at the base of an electromagnetic signal transmission/reception tower. The subject matter disclosed by Kidwell and Fraim describes a method and apparatus for using coaxial flow heat exchanging structures for regulating the temperature of heat-generating electronics installed in the base housing of an electromagnetic signal transmission/reception tower. The heat transfer is effected using a fluid flow loop from the surface to the underground environment and back to the surface. Chainer, in U.S. Pat. Application No. 2013/0081781 describes a system for data center cooling wherein heat transfer fluid is removed from the indoor volume of the data center and cooled via ambient air and geothermal heat exchange processes.

Attlesey, et al. in U.S. Pat. No. 7,724,517 (2010) disclose a design of a case for a liquid submersion cooled electronic device; the embodiments described therein include a liquid-tight case for enclosing electronic equipment, with at least a portion of one of the walls composed of translucent or transparent material for visibility into the interior of the case. In several subsequent patents, Attlesey describes cooling of electronic equipment by means of a dielectric liquid circulating in and through a fluid-tight container. Tufty et al. disclose a similar approach in U.S. Pat. Application No. 2013/0081790 (April 2013). Campbell, et al. in U.S. Pat. No. 7,961,475 (June 2011) describe an apparatus and method for immersion cooling of one or more electronic subsystems in which cooling fluid passes in and out of one or more containers docked within an electronics rack.

In conclusion, the heat generated by computer and other electronic hardware results in significant cooling costs in environments, such as data centers, where systems are deployed in high density configurations.

Unless specifically stated as such, the preceding is not admitted to be prior art and no statement appearing in this section should be interpreted as a disclaimer of any features or improvements listed.

BRIEF DESCRIPTION OF THE INVENTION

At least one embodiment described herein provides a cooling mechanism for electronic devices and systems of devices, including but not limited to computer hardware systems, installed in a subsurface environment. The design provides a significant improvement in long-term electronic equipment operating costs by eliminating the inefficiencies inherent in removing heat from the human-inhabited environment of the facility in which the hardware is installed. The unique installation characteristics of this invention are likely to lead to a lower average operating temperature of the hardware, which will translate into a longer average operational lifetime of the hardware. The design also results in a very high security physical installation for electronic equipment systems.

In its most basic embodiment, the design comprises electronic devices, either as individual units or as a cluster of units, installed in a containment vessel designed to conduct heat from the electronic devices to a fluid within a containment vessel; cooling of the electronic devices is accomplished by heat transfer from the electronic devices to a fluid within the containment vessel and finally heat transfer from the fluid to an external environment. The containment vessel exists primarily or entirely in a subsurface environment and can have any size, shape, or orientation as dictated by the constraints of the particular installation requirements.

Electronic devices are installed in a containment vessel as individual units or in a grouped as units in a high-density configuration. Multiple containment vessels may be installed together to form a group of containment vessels that collectively house a large-scale installation of electronic devices. Designs are optimized for effective and efficient direct transfer of thermal energy away from heat-generating electronic devices enclosed in a containment vessel which is primarily or entirely installed in a subsurface environment.

Heat generated by the electronic devices is transported away from the electronic devices by either direct, indirect, or direct and indirect contact with a cooling fluid that transports the captured heat to a) thermally conductive walls of a containment vessel and into the environment surrounding a containment vessel and/or b) an external heat exchanger assembly. Heat may be transferred from the fluid directly into the subsurface environment via passive or forced circulation, or the fluid may be circulated out of a containment vessel, cooled in an external location, and then re-circulated back to a containment vessel at a lower temperature. A containment vessel may have entrances, optionally fluid-tight, for power, networking, control, monitoring signals, and/or cooling fluid inlets and outlets.

Multiple configuration options are described for optimized installation of containment vessels into a variety of subsurface environments, such as, but not limited to, a naturally occurring or man-made borehole, excavation, structure, well hole, or body of water (e.g. stock tank, reservoir, lake, pool, river, ocean, sea, stream, wetland, etc.). The installation of a containment vessel can be in any orientation and can be positioned at the surface or any distance below the surface, with or without direct contact to the above-surface environment. Electronic devices are disposed within a containment vessel in a variety of configurations that allow cooling fluid to flow over, around, through, and in the electronic devices to provide for heat transfer from the electronic device to the cooling fluid. Electronics device units may be stacked or grouped together to form a single structural unit, or they may be in close proximity as single units not in direct contact with other units.

These and other aspects of the disclosed subject matter, as well as additional novel features, will be apparent from the description provided herein. The intent of this summary is not to be a comprehensive description of the claimed subject matter, but rather to provide a short overview of some of the subject matter's functionality. Other systems, methods, features and advantages here provided will become apparent to one with skill in the art upon examination of the following FIGS and detailed description. It is intended that all such additional systems, methods, features and advantages that are included within this description, be within the scope of the claims and any claims filed later.

BRIEF DESCRIPTION OF FIGURES

The features characteristic of the invention are set forth in the claims and any claims filed later. However, the invention itself and further objectives and advantages thereof, will best be understood by reference to the following detailed description when read in conjunction with the accompanying drawings in which the left-most significant digit(s) in the reference numerals denote(s) the first figure in which the respective reference numerals appear, wherein:

DETAILED DESCRIPTION

Although described with reference to certain embodiments, those with skill in the art will recognize that the disclosed embodiments have relevance to a wide variety of areas in addition to the specific examples described below. Further, elements from one or more embodiments may be used in other embodiments and elements may be removed from an embodiment and remain within the scope of this disclosure.

All references, including publications, patent applications, and patents, cited herein are hereby incorporated by reference to the same extent as if each reference were individually and specifically indicated to be incorporated by reference and were set forth in its entirety herein; provided, however, to the extent there exists a conflict between this disclosure and a document incorporated by reference, this disclosure shall control.

For the purposes of the present invention, the terms "electronic device", "electronic devices", "computer", "computer systems", "computer hardware systems", "computer cluster", "physical computer", "computer server", and "server" are used interchangeably, and unless otherwise specified comprise any number of electronic components or electronic component assemblies.

For the purposes of the present invention, the term "fluid" is defined as a liquid, a gas, or a combination of liquid and gas.

For the purposes of the present invention, the terms "thermally conductive fluid" and "cooling fluid" are used interchangeably and are defined as a fluid capable of absorbing and rejecting heat.

For the purposes of the present invention, the term "adjacent" is defined as adjoining, bordering, touching along an edge or a point, or having a common endpoint or border.

For the purposes of the present invention, the term "remote" is defined as not adjacent.

Figure 1:
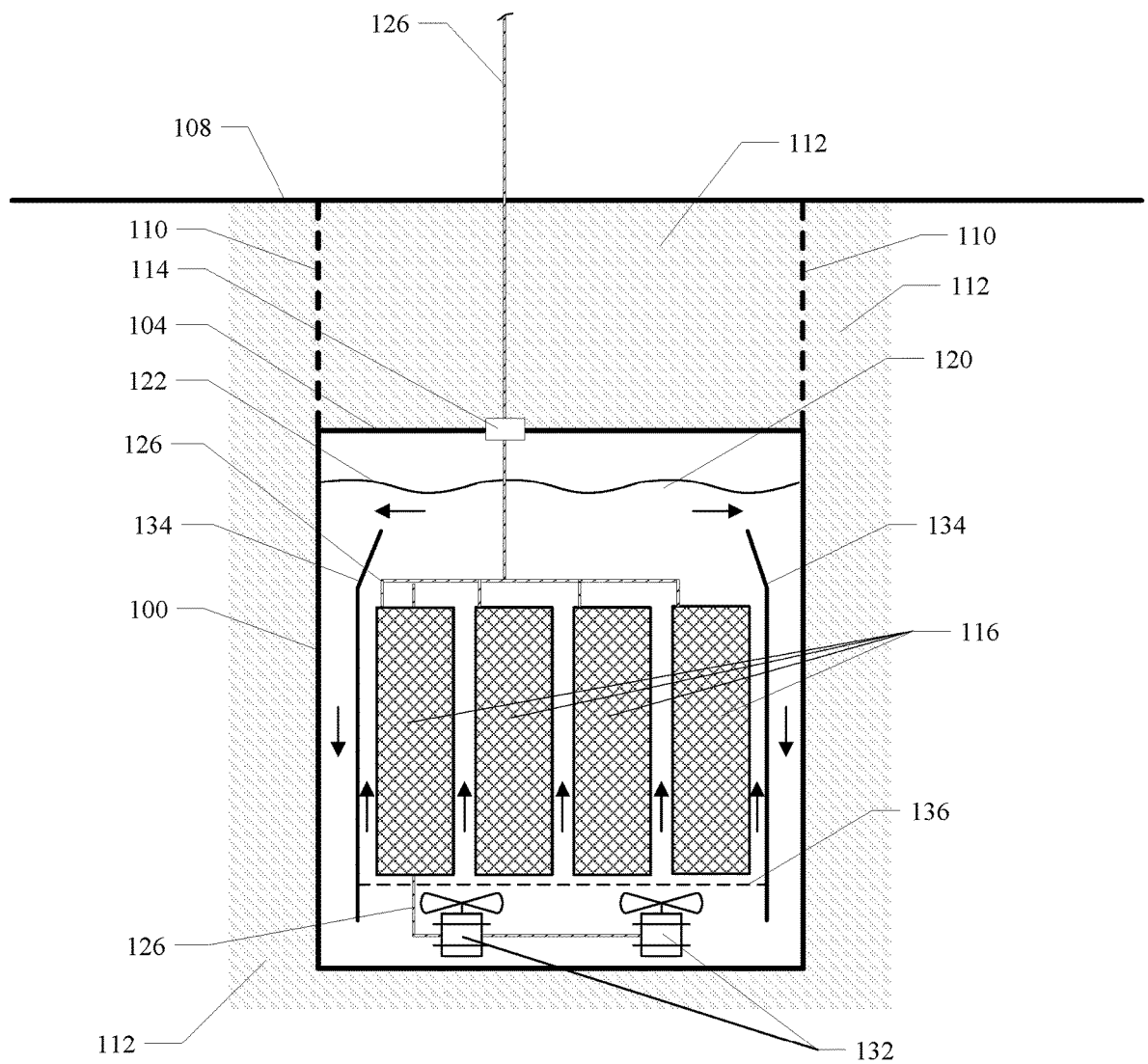
FIG. 1 shows a conceptual cross-section of a containment vessel with convection cooling that encloses electronic devices with flow-over cooling which is designed for subsurface installation according to an embodiment of the disclosed subject matter.

FIG. 1 shows a conceptual cross-section of a containment vessel with convection cooling that encloses electronic devices with flow-over cooling which is designed for subsurface installation. The containment vessel 100 encloses one or more electronic devices 116. The containment vessel 100 is a sealed or unsealed structure which is near or any distance below surface level 108. The containment vessel 100 is installed in either a removable or non-removable fashion in surrounding physical materials 112 such as earth, water, or concrete. The sealed embodiment will have a sealing cap 104 which may be covered by surrounding physical materials 112. The unsealed embodiment will have containment vessel walls 110 that extend to the surface of the surrounding physical materials 112. A fluid-tight connector assembly 114 extends through any sealing cap 104 to provide an entry port for power, control and electrical signal cabling 126 to and from a) one or more electronic devices 116, and b) any optional fluid circulators 132. The cooling fluid 120 with surface level 122 partially or completely fills the interior volume of the containment vessel 100 and surrounds the electronic devices 116. The cooling fluid 120 circulates within the containment vessel 100 in a manner as to effect the heat removal from the electronic devices 116. Fluid flow in and around the electronic devices 116 may be accomplished by embodiments of electronic devices 116 such as those described in FIGS. 7, 8, 9, and/or 10.

Heat from the warmer electronic devices 116 is transferred to the cooling fluid 120. The cooling fluid 120 convectively moves toward the upper region of the containment vessel 100 optionally assisted by one or more fluid circulators 132. The cooling fluid 120 moves toward the walls of the containment vessel 100 and flows along the walls of the containment vessel 100 toward the lower region of the containment vessel 100. As the cooling fluid 120 moves along the walls of the containment vessel 100, heat is transferred from the cooling fluid 120 to the walls of the containment vessel 100 and into the surrounding physical materials 112. The cooling fluid 120 flows to the lower region of the containment vessel 100 and then begins to move upward, flowing over the electronic devices 116 to continue the heat removal cycle. The flow of cooling fluid 120 over electronic devices 116 may be augmented by one or more optional fluid circulators 132 which move the cooling fluid 120 from the lower region of the containment vessel 100 to the upper region of the containment vessel 100. An optional fluid control structure 136 may be used to promote uniform fluid flow over electronic devices 116. Fluid control structures 134 may be located within the containment vessel 100 in order assist in internal fluid circulation by providing a flow separation boundary between the cooler cooling fluid 120 which moves downward near the containment vessel 100 walls and the warmer cooler fluid 120 which moves upward over the electronic devices 116. Multiple containment vessels 100 may be installed together to form a group of containment vessels 100 that collectively house a large-scale installation of electronic devices 116. The containment vessel 100 is optionally comprised of thermally conductive materials.

Figure 2:
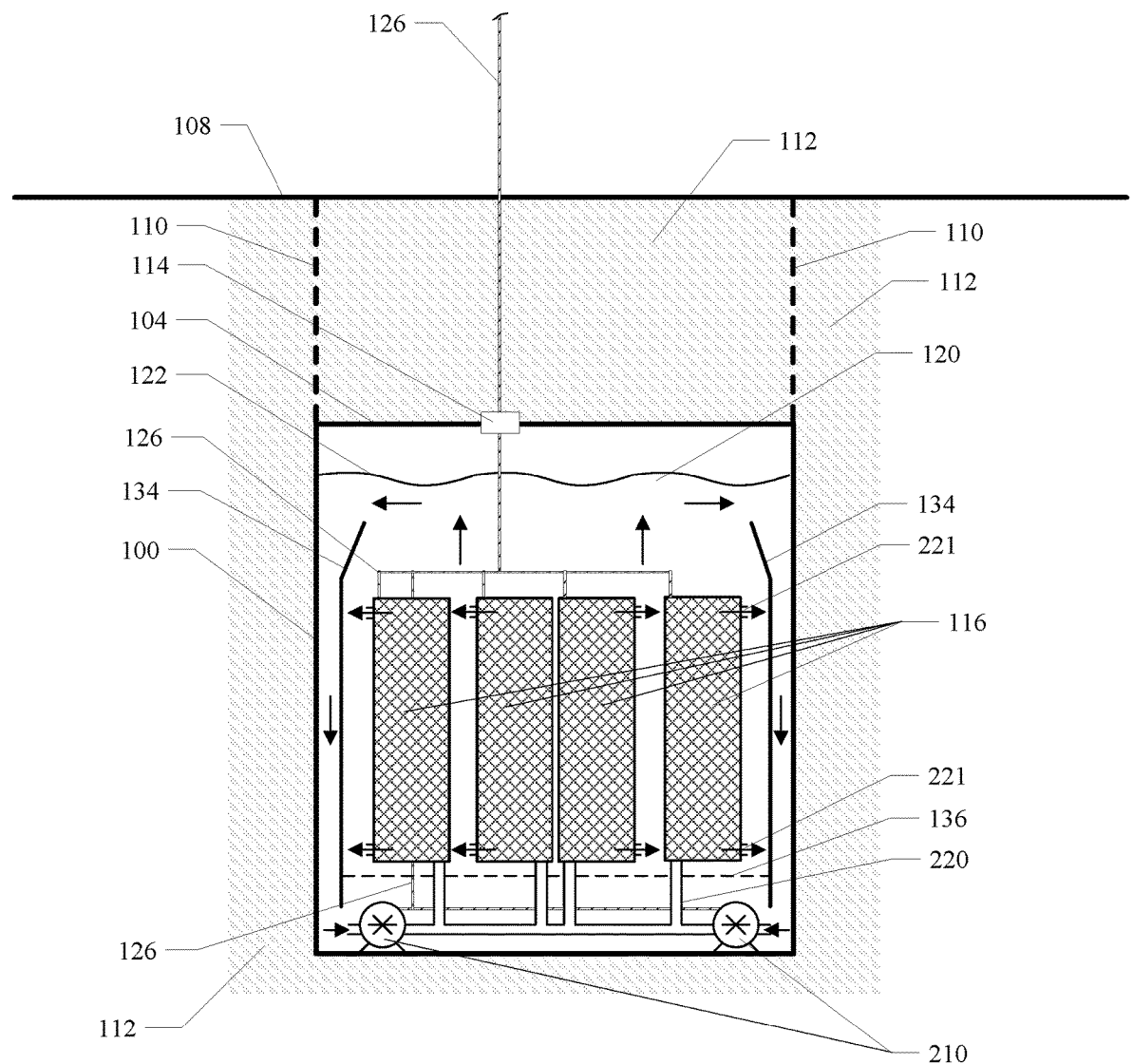
FIG. 2 shows a conceptual cross-section of a containment vessel with convection cooling that encloses electronic devices with cooling which is designed for subsurface installation according to an embodiment of the disclosed subject matter.
Figure 7:
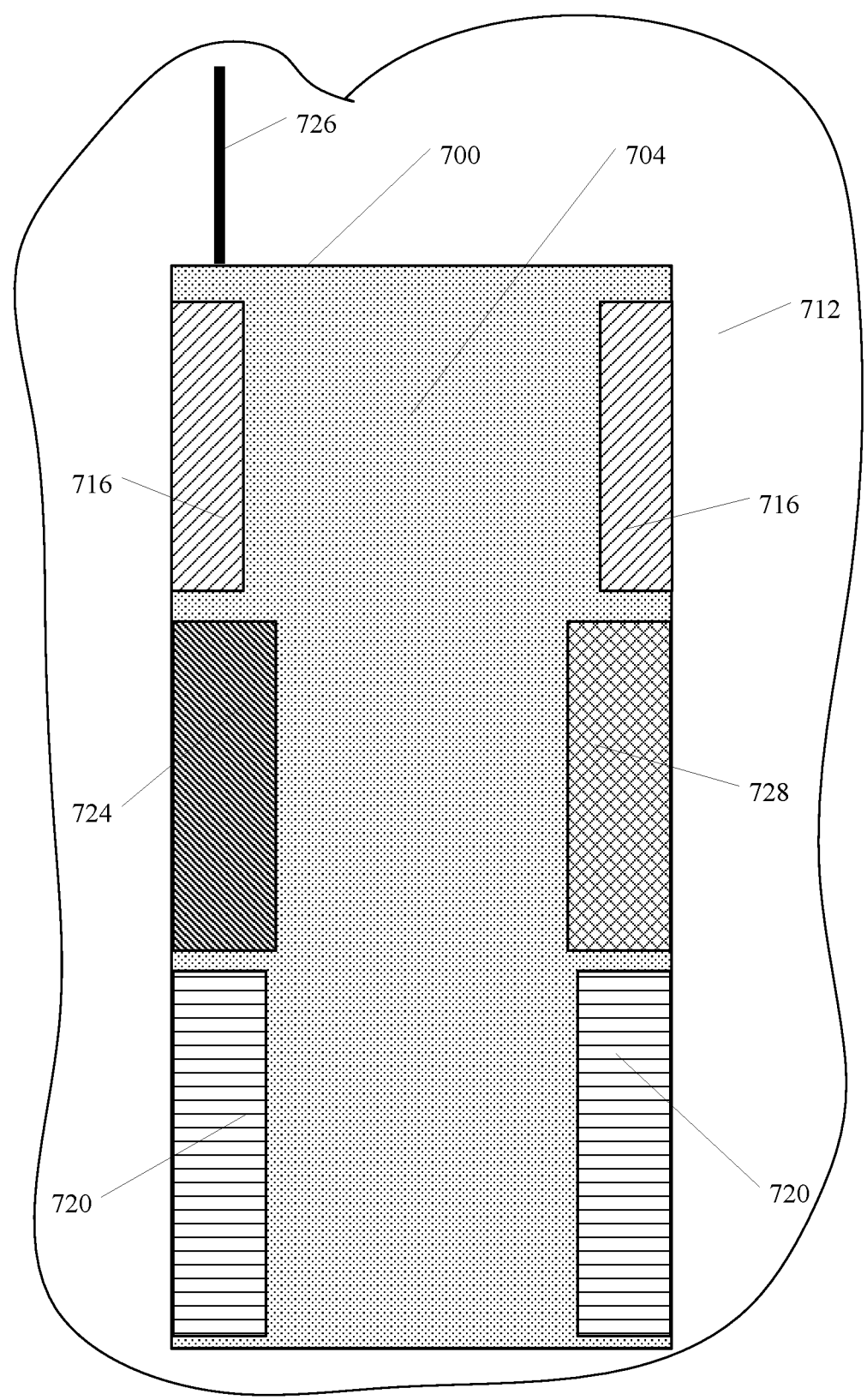
FIG. 7 shows a conceptual cross-section of an electronic device designed for subsurface installation that comprises electronic components that are cooled by external cooling fluid circulation according to an embodiment of the disclosed subject matter.
Figure 8:
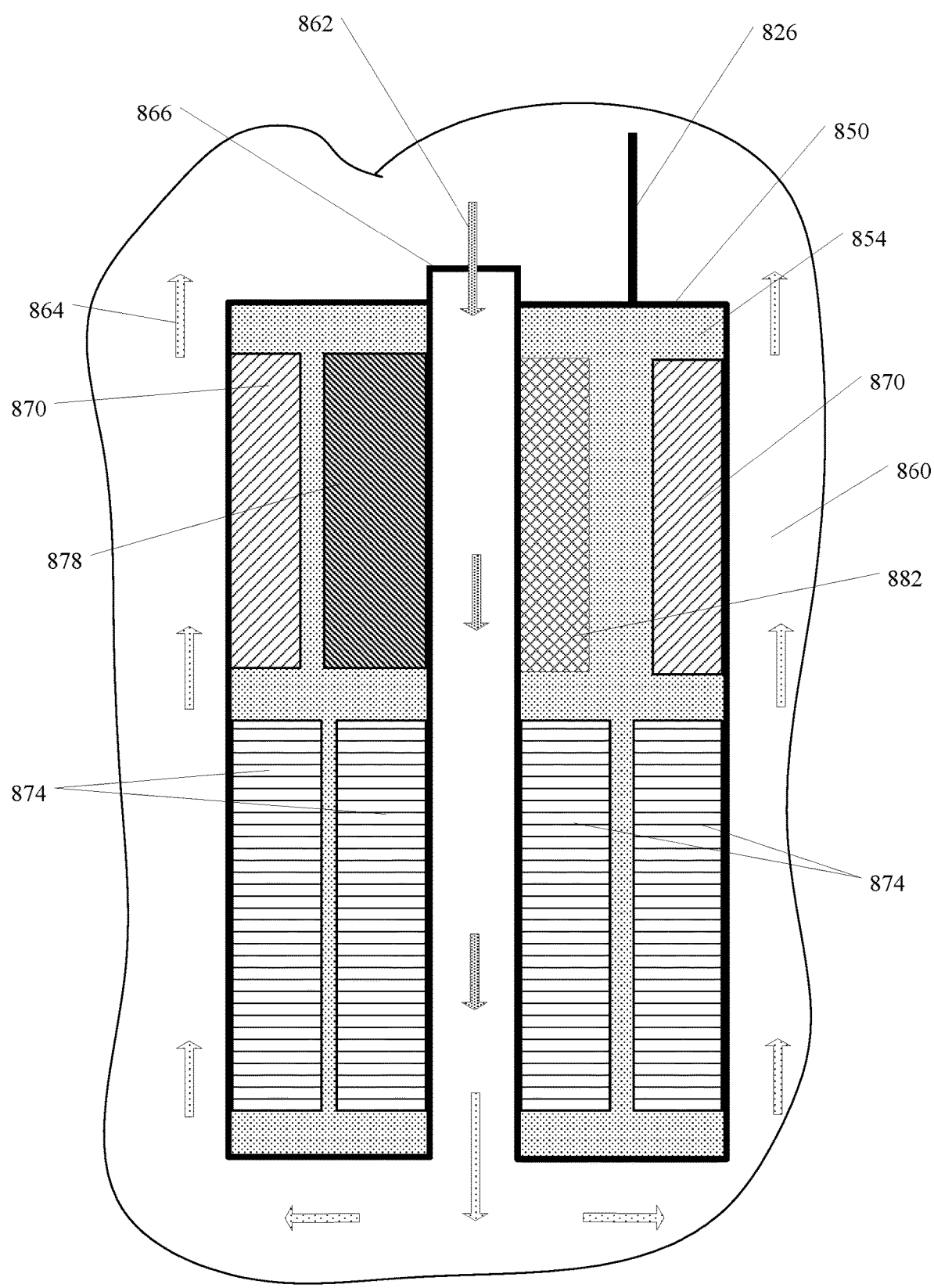
FIG. 8 shows a conceptual cross-section of an electronic device designed for subsurface installation that comprises electronic components that are cooled by interior channel and external cooling fluid circulation according to an embodiment of the disclosed subject matter.
Figure 9:
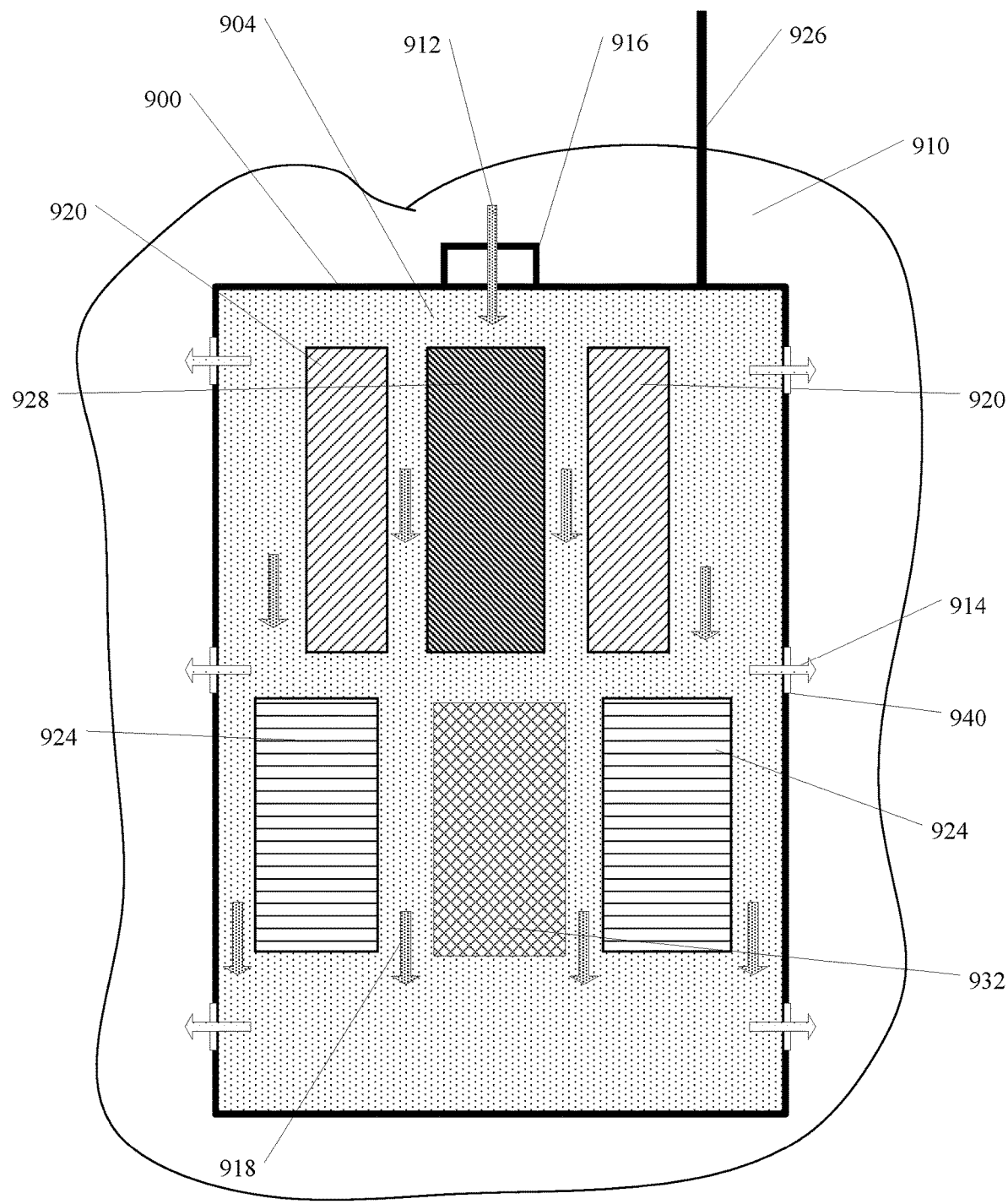
FIG. 9 shows a conceptual cross-section of an electronic device designed for subsurface installation that comprises electronic components that are cooled by internal cooling fluid circulation according to an embodiment of the disclosed subject matter.

FIG. 2 shows a conceptual cross-section of a containment vessel with convection cooling that encloses electronic devices with cooling which is designed for subsurface installation. The containment vessel 100 encloses one or more electronic devices 116. The containment vessel 100 is a sealed or unsealed structure which is near or any distance below surface level 108. The containment vessel 100 is installed in either a removable or non-removable fashion in surrounding physical materials 112 such as earth, water, or concrete. The sealed embodiment will have a sealing cap 104 which may be covered by surrounding physical materials 112. The unsealed embodiment will have containment vessel walls 110 that extend to the surface of the surrounding physical materials 112. A fluid-tight connector assembly 114 extends through any sealing cap 104 to provide an entry port for power, control and electrical signal cabling 126 to and from a) one or more electronic devices 116, and b) one or more fluid pumps 210. The cooling fluid 120 with surface level 122 partially or completely fills the interior volume of the containment vessel 100 and surrounds the electronic devices 116. The cooling fluid 120 circulates within the containment vessel 100 in a manner as to effect the heat removal from the electronic devices 116. Heat from the warmer electronic devices 116 is transferred to the cooling fluid 120. The cooling fluid 120 flows in and around the electronic devices 116 in a manner that includes fluid flows described in embodiments of electronic devices 116 such as shown in FIGS. 7, 8, 9, and/or 10.

The cooling fluid 120 is circulated within the containment vessel 100 by means of one or more fluid pumps 210 that may be at any location and are shown as positioned in the lower region of the containment vessel 100. A fluid pump 210 has an inlet for cooling fluid 120, performs a pumping action on cooling fluid 120 and delivers the cooling fluid 120 to an outlet that is attached to fluid distribution piping 220 which delivers cooling fluid 120 to each electronic device 116 as appropriate. The pumping action of the fluid pump 210 moves cooling fluid 120 into electronic devices 116 and the fluid is discharged back into the containment vessel 100 through fluid exit ports 221. Fluid exit ports 221 are shown as representative of ports that allow cooling fluid 120 to be discharged from the interior of any electronic device 116. Each electronic device 116 may include any number of fluid exit ports 221 that may be located at any appropriate location on electronic device 116. The cooling fluid 120 moves both convectively and under pumping action toward the upper region of the containment vessel 100. The fluid pump 210 may be optionally configured to allow a portion of the circulating cooling fluid 120 to bypass the fluid pump 210 inlet and flow upward in the containment vessel 100 over the electronic devices 116 toward the upper region of the containment vessel 100 thereby effecting additional heat transfer from the electronic devices 116. An optional fluid control structure 136 may be used to promote uniform fluid flow over electronic devices 116. Upon reaching the upper region of the containment vessel 100, the cooling fluid 120 moves toward the walls of the containment vessel 100 and flows along the walls of the containment vessel 100 toward the lower region of the containment vessel 100. As the cooling fluid 120 moves along the walls of the containment vessel 100, heat is transferred from the cooling fluid 120 to the walls of the containment vessel 100 and into the surrounding physical materials 112. The cooling fluid 120 flows to the lower region of the containment vessel 100 to continue the heat removal cycle. Fluid control structures 134 may be located within the containment vessel 100 in order assist in internal fluid circulation by providing a flow separation boundary between the cooler cooling fluid 120 which moves downward near the containment vessel 100 walls and the warmer cooler fluid 120 which moves upward over the electronic devices 116. Multiple containment vessels 100 may be installed together to form a group of containment vessels 100 that collectively house a large-scale installation of electronic devices 116. The containment vessel 100 is optionally comprised of thermally conductive materials.

Figure 3:
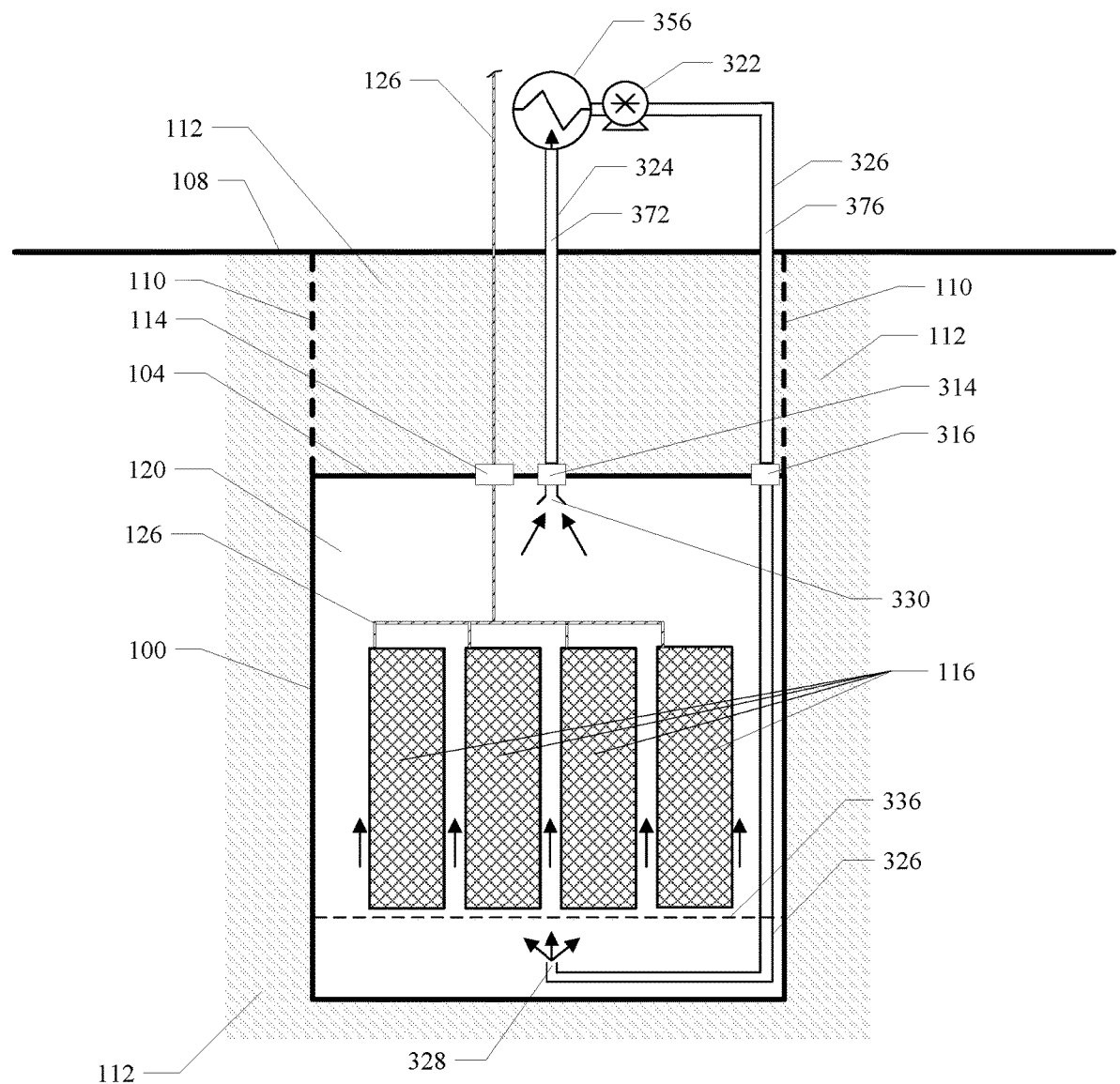
FIG. 3 shows a conceptual cross-section of a containment vessel with external heat exchanger that encloses electronic devices with flow-over cooling which is designed for subsurface installation according to an embodiment of the disclosed subject matter.

FIG. 3 shows a conceptual cross-section of a containment vessel with external heat exchanger that encloses electronic devices with flow-over cooling which is designed for subsurface installation. The containment vessel 100 encloses one or more electronic devices 116. The containment vessel 100 is a sealed or unsealed structure which is near or any distance below surface level 108. The containment vessel 100 is installed in either a removable or non-removable fashion in surrounding physical materials 112 such as earth, water, or concrete. The sealed embodiment will have a sealing cap 104 which may be covered by surrounding physical materials 112. The unsealed embodiment will have containment vessel walls 110 that extend to the surface of the surrounding physical materials 112. A fluid-tight connector assembly 114 extends through any sealing cap 104 to provide an entry port for power, control and electrical signal cabling 126 to and from one or more electronic devices 116. The cooling fluid 120 partially or completely fills the interior volume of the containment vessel 100 and surrounds the electronic devices 116. The cooling fluid 120 circulates and/or performs in a manner as to effect the heat removal from the electronic devices 116. In this embodiment the cooling fluid 120 circulates to a heat exchanger assembly 356 installed external to, and either adjacent to or remote from, the containment vessel 100.

Heat from the warmer electronic devices 116 is transferred to the cooling fluid 120. The cooling fluid 120 is warmed and moves toward the upper region of the containment vessel 100 where the warmer cooling fluid 372 is circulated out of the containment vessel 100 via outlet 330 and connecting line 324 that extends through fluid-tight connector assembly 314 and connects to one or more external adjacent or remote heat exchanger assemblies 356. Outlet 330 may be disposed at any location inside the containment vessel 100 and may comprise one or more outlets 330. The heat exchanger assembly 356 removes a portion of the heat from the warmer cooling fluid 372 and returns the resulting cooler cooling fluid 376 to the containment vessel 100 via connecting line 326 that extends through fluid-tight connector assembly 316 and further extends to any location in the containment vessel 100 returning the cooler cooling fluid 376 to the containment vessel 100 through inlet 328. Fluid-tight connector assemblies 314, 316 are comprised of one or more fluid-tight connections through any sealing cap 104. The cooling fluid 120 begins to move upward in the containment vessel 100, flowing over the electronic devices 116 to continue the heat removal cycle. An optional fluid control structure 336 may be used to promote uniform fluid flow over electronic devices 116. Fluid flow in and around the electronic devices 116 may be accomplished by embodiments of electronic devices 116 such as those described in FIGS. 7, 8, 9, and/or 10.

The heat exchanger assembly 356 is comprised of at least one heat exchanger system that removes heat from the cooling fluid 120, 372 and rejects the removed heat into the adjacent environment of the heat exchanger assembly 356 or an environment remote to the heat exchanger assembly 356. The heat exchanger assembly 356 is comprised of at least one heat exchange system that may accomplish heat rejection by a variety of heat rejection means that include, but are not limited to, ventilation, compression, evaporation, dry cooler, fluid to fluid, and geothermal. The heat exchanger assembly 356 may use one or more fluid pumps 322 to assist in the circulation action of the cooling fluid 120, 372, 376. The heat exchanger assembly 356 is located external to, and either adjacent to or remote from, the containment vessel 100. A heat exchanger assembly 356 may function to remove heat from the cooling fluid 120 for more than one containment vessel 100. Multiple containment vessels 100 may be installed together to form a group of containment vessels 100 that collectively house a large-scale installation of electronic devices 116. The containment vessel 100 is optionally comprised of thermally conductive materials. In one embodiment configured for indirect heat transfer from electronic devices 116 to cooling fluid 120, the cooling fluid 120 is segregated into two distinct portions that are structured and function as described in FIG. 11.

Figure 4:
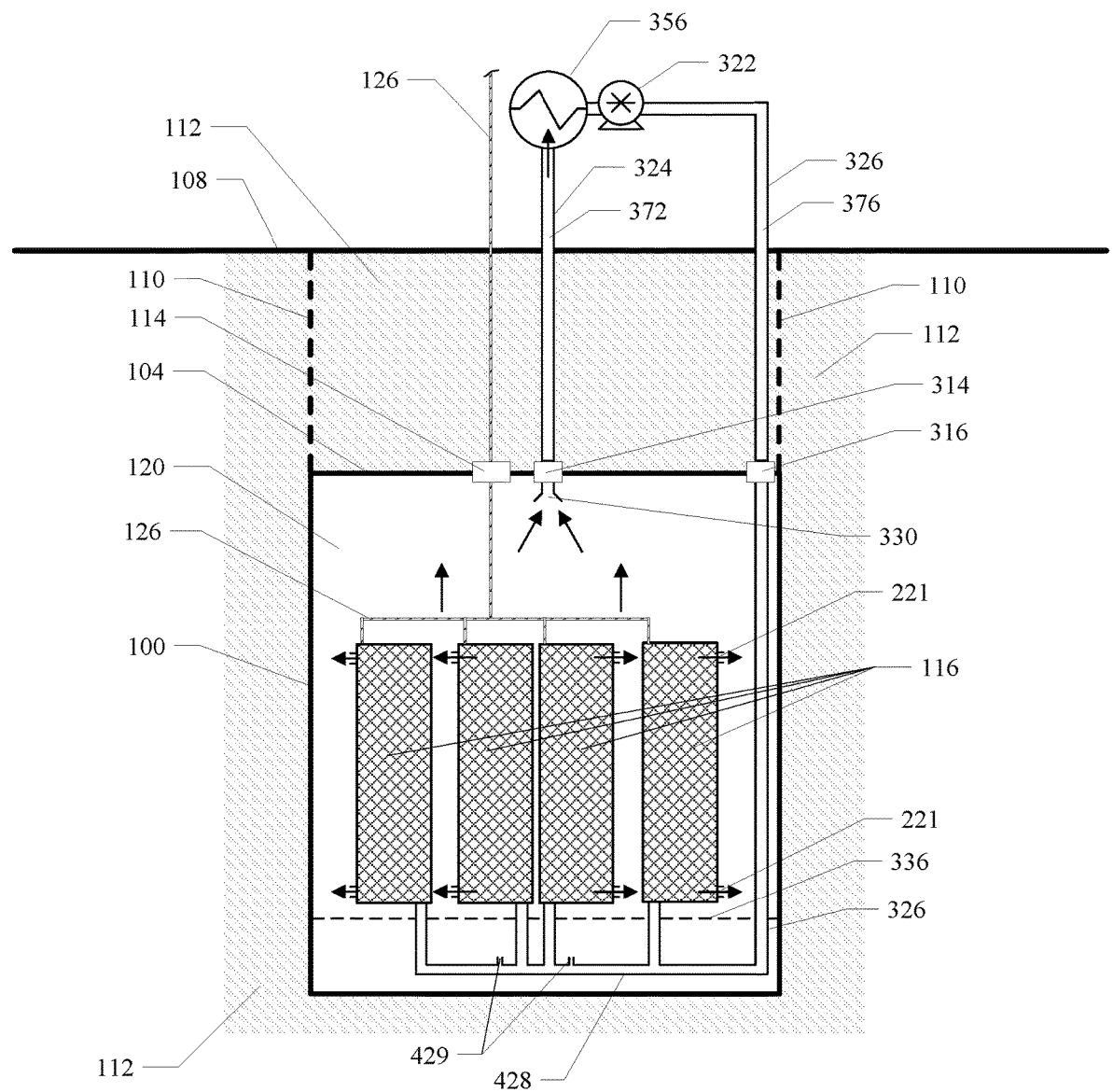
FIG. 4 shows a conceptual cross-section of a containment vessel with external heat exchanger that encloses electronic devices with cooling which is designed for subsurface installation according to an embodiment of the disclosed subject matter.

FIG. 4 shows a conceptual cross-section of a containment vessel with external heat exchanger that encloses electronic devices with cooling which is designed for subsurface installation. The containment vessel 100 encloses one or more electronic devices 116. The containment vessel 100 is a sealed or unsealed structure which is near or any distance below surface level 108. The containment vessel 100 is installed in either a removable or non-removable fashion in surrounding physical materials 112 such as earth, water, or concrete. The sealed embodiment will have a sealing cap 104 which may be covered by surrounding physical materials 112. The unsealed embodiment will have containment vessel walls 110 that extend to the surface of the surrounding physical materials 112. A fluid-tight connector assembly 114 extends through any sealing cap 104 to provide an entry port for power, control and electrical signal cabling 126 to and from one or more electronic devices 116. The cooling fluid 120 partially or completely fills the interior volume of the containment vessel 100 and surrounds the electronic devices 116. The cooling fluid 120 circulates and/or performs in a manner as to effect the heat removal from the electronic devices 116. In this embodiment the cooling fluid 120 circulates to a heat exchanger assembly 356 installed external to, and either adjacent to or remote from, the containment vessel 100.

Heat from the warmer electronic devices 116 is transferred to the cooling fluid 120. The cooling fluid 120 flows in and around the electronic devices 116 in a manner that includes fluid flows described in embodiments of electronic devices 116 such as shown in FIGS. 7, 8, 9, and/or 10. The cooling fluid 120 is warmed and moves toward the upper region of the containment vessel 100 where the warmer cooling fluid 372 is circulated out of the containment vessel 100 via outlet 330 and connecting line 324 that extends through fluid-tight connector assembly 314 and connects to one or more external adjacent or remote heat exchanger assemblies 356. Outlet 330 may be disposed at any location inside the containment vessel 100 and may comprise one or more outlets 330. The heat exchanger assembly 356 removes a portion of the heat from the warmer cooling fluid 372 and returns the resulting cooler cooling fluid 376 to the containment vessel 100 via connecting line 326 that extends through fluid-tight connector assembly 316 and further extends to any location in the containment vessel 100 returning the cooler cooling fluid 376 to within the containment vessel 100 through fluid distribution piping 428 which delivers cooling fluid 120, 376 to each electronic device 116 as appropriate. Fluid-tight connector assemblies 314, 316 are comprised of one or more fluid-tight connections through any sealing cap 104. The cooling fluid 120 flows through electronic devices 116 and the fluid is discharged back into the containment vessel 100 through fluid exit ports 221. Fluid exit ports 221 are shown as representative of ports that allow cooling fluid 120 to be discharged from the interior of any electronic device 116. Each electronic device 116 may include any number of fluid exit ports 221 that may be located at any appropriate location on a electronic device 116. The cooling fluid 120 moves both convectively and under circulation action toward the upper region of the containment vessel 100. The fluid distribution piping 428 may be optionally configured to allow a portion of the circulating cooling fluid 120 to be released into the containment vessel 100 via ports 429 enabling cooling fluid 120 to flow upward in the containment vessel 100 over the electronic devices 116 toward the upper region of the containment vessel 100 thereby effecting additional heat transfer from the electronic devices 116. An optional fluid control structure 336 may be used to promote uniform fluid flow over electronic devices 116.

The heat exchanger assembly 356 is comprised of at least one heat exchanger system that removes heat from the cooling fluid 120, 372 and rejects the removed heat into the adjacent environment of the heat exchanger assembly 356 or an environment remote to the heat exchanger assembly 356. The heat exchanger assembly 356 is comprised of at least one heat exchange system that may accomplish heat rejection by a variety of heat rejection means that include, but are not limited to, ventilation, compression, evaporation, dry cooler, fluid to fluid, and geothermal. The heat exchanger assembly 356 may use one or more fluid pumps 322 to assist in the circulation action of the cooling fluid 120, 372, 376. The heat exchanger assembly 356 is located external to, and either adjacent to or remote from, the containment vessel 100. A heat exchanger assembly 356 may function to remove heat from the cooling fluid 120 for more than one containment vessel 100. Multiple containment vessels 100 may be installed together to form a group of containment vessels 100 that collectively house a large-scale installation of electronic devices 116. The containment vessel 100 is optionally comprised of thermally conductive materials. In one embodiment configured for indirect heat transfer from electronic devices 116 to cooling fluid 120, the cooling fluid 120 is segregated into two distinct portions that are structured and function as described in FIG. 11.

Figure 5:
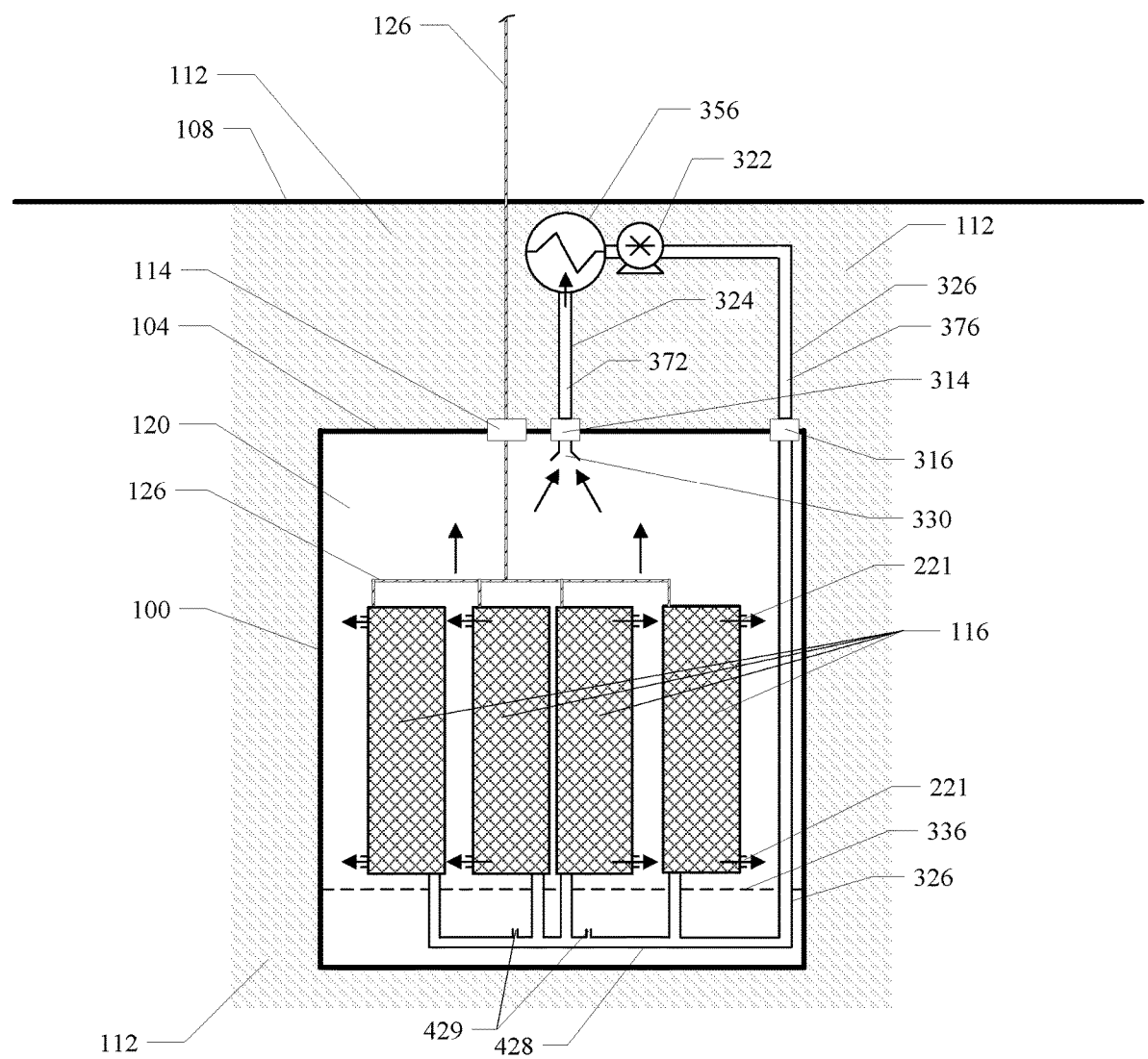
FIG. 5 shows a conceptual cross-section of a containment vessel with external subsurface heat exchanger that encloses electronic devices with cooling which is designed for subsurface installation according to an embodiment of the disclosed subject matter.

FIG. 5 shows a conceptual cross-section of a containment vessel with external subsurface heat exchanger that encloses electronic devices with cooling which is designed for subsurface installation. FIG. 5 shows a configuration similar to that of FIG. 4, the primary difference being that heat exchanger assembly 356 and optional fluid pump 322 are located in a subsurface environment external to, and either adjacent to or remote from, the containment vessel 100. In one embodiment configured for indirect heat transfer from electronic devices 116 to cooling fluid 120, the cooling fluid 120 is segregated into two distinct portions that are structured and function as described in FIG. 11.

Figure 6:
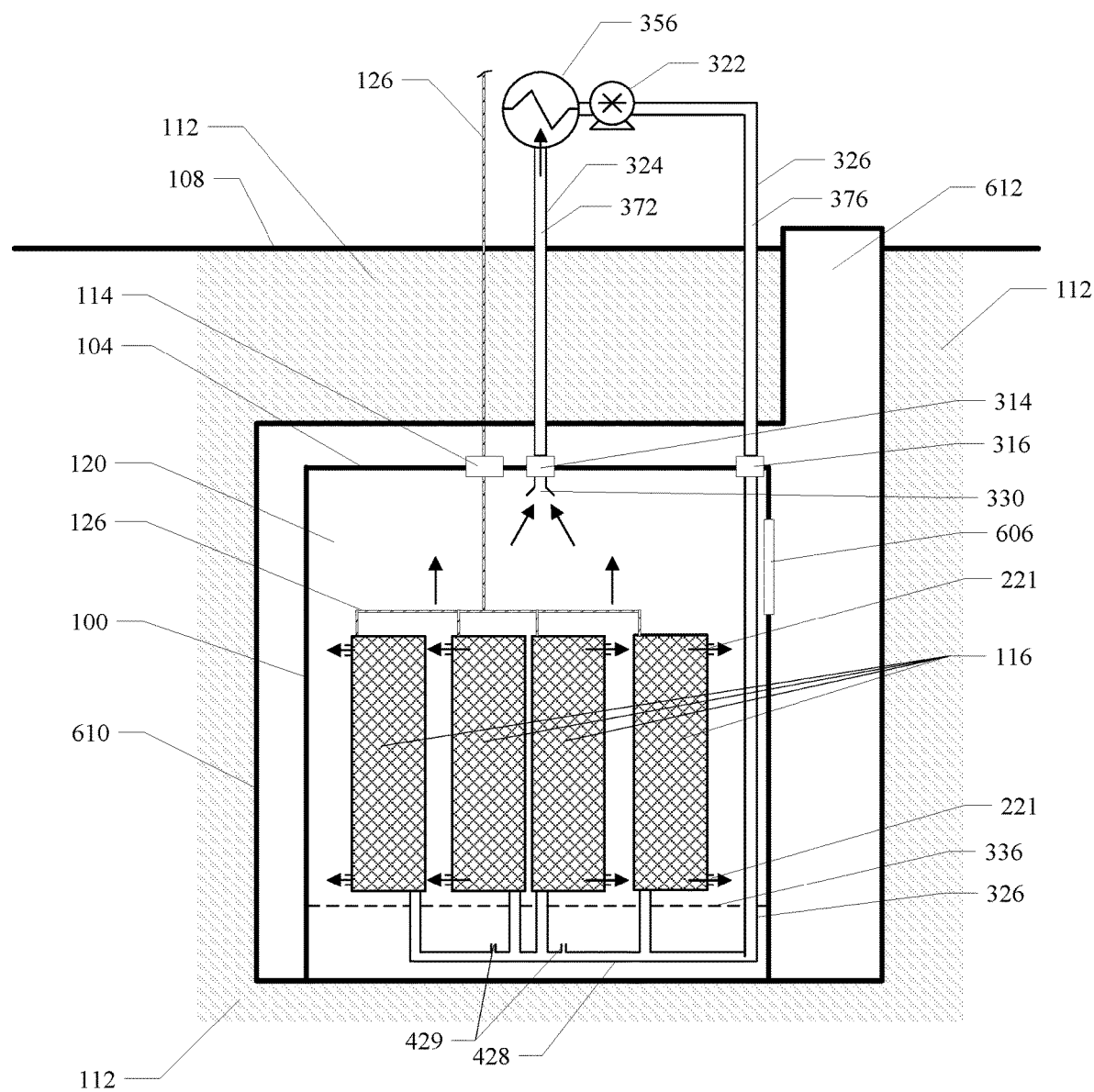
FIG. 6 shows a conceptual cross-section of a containment vessel with external heat exchanger that encloses electronic devices with cooling which is designed for human-accessible subsurface installation according to an embodiment of the disclosed subject matter.

FIG. 6 shows a conceptual cross-section of a containment vessel with external heat exchanger that encloses electronic devices with cooling which is designed for human-accessible subsurface installation. FIG. 6 shows a configuration similar to that of FIG. 4, the primary difference being the presence of a secondary containment vessel 610 that is sufficiently large and of the correct environment and structure to facilitate human access, inspection, and maintenance of at least a portion of the containment vessel 100. Multiple containment vessels 100 may be installed in a single secondary containment vessel 610. The containment vessel 100 is installed in either a removable or non-removable fashion inside the secondary containment vessel 610. The secondary containment vessel 610 is installed in surrounding physical materials 112 such as earth, water, or concrete and contains a human accessible extension 612 to the surface. The containment vessel 100 will allow human access inside the containment vessel 100, optionally through an access panel or port 606.

FIG. 7 shows a conceptual cross-section of an electronic device designed for subsurface installation that comprises electronic components that are cooled by external cooling fluid circulation. FIGS. 1, 2, 3, 4, 5, and/or 6 above refer to the electronic device of this section as an electronic device 116. This embodiment provides an enclosure 700 for the electronic device, with a fluid filled interior space 704, and an entry port for power, control and electrical signal cabling 726. The exterior surface of the enclosure 700 is in contact with a surrounding cooling fluid 712 which circulates and is cooled in any of the manners described for FIGS. 1, 2, 3, 4, 5, and/or 6 above. Cooling fluid 712 may optionally be circulated within enclosure 700 by various devices including fluid circulators, fluid fans, and fluid pumps that are located internally or externally to enclosure 700.

The electronic components which are interior to the enclosure 700 include one or more power supplies 716, one or more data storage assemblies 720 comprising disk drives or other type of storage units, one or more motherboard assemblies 724, and other custom electronic device assembly 728 that may be required by a particular application. The motherboard assembly 724, power supply assembly 716, data storage assembly 720, and custom electronic device assembly 728 are electronic component assemblies that contain electronic components that have been arranged in a manner to facilitate proper operation and optimal heat transfer; they may be bracket mounted and open to the interior of the enclosure 700 or each electronic component assembly 724, 716, 720, 728 may be fully enclosed as a unit in order to either contain a secondary cooling fluid such as a dielectric or to isolate the electronic component assembly 724, 716, 720, 728 from direct contract with either the cooling fluid 712 or another secondary cooling fluid. Each electronic component assembly 724, 716, 720, 728 will have cable entrances for power and electrical signaling that serve to interconnect the electronic component assemblies. Each electronic component assembly 724, 716, 720, 728 may be mounted in such a fashion as to transfer heat directly from the electronic component assembly 724, 716, 720, 728 to the wall of the enclosure 700. The interior 704 of the enclosure 700 may contain fluids separated by interior partitions and control structures that serve to transfer heat from the inward facing surfaces of electronic component assemblies 724, 716, 720, 728 to the outer wall of the enclosure 700. The electronic component assemblies interior to the enclosure 700 do not need to be arranged exactly as shown and may have various arrangements to facilitate heat transfer and operation. Multiple enclosures 700 may be connected in a single logical and/or physical structure as to form a single operating and/or installed unit.

FIG. 8 shows a conceptual cross-section of an electronic device designed for subsurface installation that comprises electronic components that are cooled by interior channel and external cooling fluid circulation. FIGS. 1, 2, 3, 4, 5, and/or 6 above refer to the electronic device of this section as an electronic device 116. This embodiment provides an enclosure 850 for the electronic device, with a fluid filled interior space 854, and an entry port for power, control and electrical signal cabling 826. This embodiment has a pipe-like cylindrical or tubular enclosure 850 of various cross-sectional geometries and lengths that allow the flow 862 of cooling fluid 860 through one or more channels in its central space. The exterior surface of the enclosure 850 is in contact with a surrounding cooling fluid 860. The enclosure 850 has a sealing cap 866 with an entry port through which the cooling fluid 860 is forced 862. The cooling fluid 860 is warmed by contact with the surfaces of the enclosure 850 as it flows downward 862; the cooling fluid 860 exits at the bottom of the enclosure 850, then flows across the enclosure 850 surfaces as it rises 864; the cooling fluid 860 is circulated and cooled in any of the manners described for FIGS. 1, 2, 3, 4, 5, and/or 6 above. Cooling fluid 860 may optionally be circulated within or through enclosure 850 by various devices including fluid circulators, fluid fans, and fluid pumps that are located internally or externally to enclosure 850.

The electronic components interior to the enclosure 850 include one or more power supplies 870, one or more data storage assemblies 874 comprising disk drives or other type of storage units, one or more motherboard assemblies 878, and other custom electronic device assembly 882 that may be required by a particular application. The motherboard assembly 878, power supply assembly 870, data storage assembly 874, and custom electronic device assembly 882 are electronic component assemblies that contain electronic components that have been arranged in a manner to facilitate proper operation and optimal heat transfer; they may be bracket mounted and open to the interior of the enclosure 850 or each electronic component assembly 878, 870, 874, 882 may be fully enclosed as a unit in order to either contain a secondary cooling fluid such as a dielectric or to isolate the electronic component assembly 878, 870, 874, 882 from direct contract with either the cooling fluid 860 or another secondary cooling fluid. Each electronic component assembly 878, 870, 874, 882 will have cable entrances for power and electrical signaling that serve to interconnect the electronic component assemblies. Each electronic component assembly 878, 870, 874, 882 may be mounted in such a fashion as to transfer heat directly from the electronic component assembly 878, 870, 874, 882 to the wall of the enclosure 850. The interior 854 of the enclosure 850 may contain fluids separated by interior partitions and control structures that serve to transfer heat from the inward facing surfaces of electronic component assemblies 878, 870, 874, 882 to the outer wall of the enclosure 850. The electronic component assemblies interior to the enclosure 850 do not need to be arranged exactly as shown and may have various arrangements to facilitate heat transfer and operation. The circulation of the cooling fluid 860 may be reversed by moving the sealing cap 866, through which the cooling fluid 860 is forced 862, to the bottom of the enclosure 850. Multiple enclosures 850 may be connected in a single logical and/or physical structure as to form a single operating and/or installed unit.

FIG. 9 shows a conceptual cross-section of an electronic device designed for subsurface installation that comprises electronic components that are cooled by internal cooling fluid circulation. FIGS. 1, 2, 3, 4, 5, and/or 6 above refer to the electronic device of this section as an electronic device 116. This embodiment provides an enclosure 900 for the electronic device, with a fluid filled interior space 904, and an entry port for power, control and electrical signal cabling 926. This embodiment has a pipe-like cylindrical or tubular enclosure of various cross-sectional geometries and lengths that allow the flow 918 of cooling fluid 910 through the interior 904 of the enclosure 900 and around the interior electronic component assemblies. The exterior surface of the enclosure 900 is in contact with a surrounding cooling fluid 910. The enclosure 900 has a sealing cap 916 with an entry port through which the cooling fluid 910 is forced 912. The cooling fluid 910 is warmed by contact with the interior electronic component assemblies and exits the enclosure 914 through the exit ports 940 into the containment vessel. The cooling fluid 910 is circulated and cooled in any of the manners described for FIGS. 1, 2, 3, 4, 5, and/or 6 above. Cooling fluid 910 may optionally be circulated within or through enclosure 900 by various devices including fluid circulators, fluid fans, and fluid pumps that are located internally or externally to enclosure 900.

The electronic components interior to the enclosure 900 include one or more power supplies 920, one or more data storage assemblies 924 comprising disk drives or other type of storage units, one or more motherboard assemblies 928, and other custom electronic device assembly 932 that may be required by a particular application. The motherboard assembly 928, power supply assembly 920, data storage assembly 924, and custom electronic device assembly 932 are electronic component assemblies that contain electronic components that have been arranged in a manner to facilitate proper operation and optimal heat transfer; each electronic component assembly 928, 920, 924, 932 is fully enclosed as a unit in order to either contain a secondary cooling fluid such as a dielectric or to isolate the electronic component assembly 928, 920, 924, 932 from direct contract with either the cooling fluid 910 or another secondary cooling fluid. Each electronic component assembly 928, 920, 924, 932 will have cable entrances for power and electrical signaling that serve to interconnect the electronic component assemblies. Each assembly electronic component 928, 920, 924, 932 may be mounted in such a fashion as to transfer heat directly from the electronic component assembly 928, 920, 924, 932 to the wall of the enclosure 900. Alternatively or additionally, each electronic component assembly 928, 920, 924, 932 could be mounted in a fashion to maximize the electronic component assembly 928, 920, 924, 932 contact with cooling fluid 910 within enclosure 900. The electronic component assemblies interior to the enclosure 900 do not need to be arranged exactly as shown and may have various arrangements to facilitate heat transfer and operation. The circulation of the cooling fluid 910 may be reversed by moving the sealing cap 916 through which the cooling fluid 910 is forced to the bottom of the enclosure 900. Multiple enclosures 900 may be connected in a single logical and/or physical structure as to form a single operating and/or installed unit.

Figure 10:
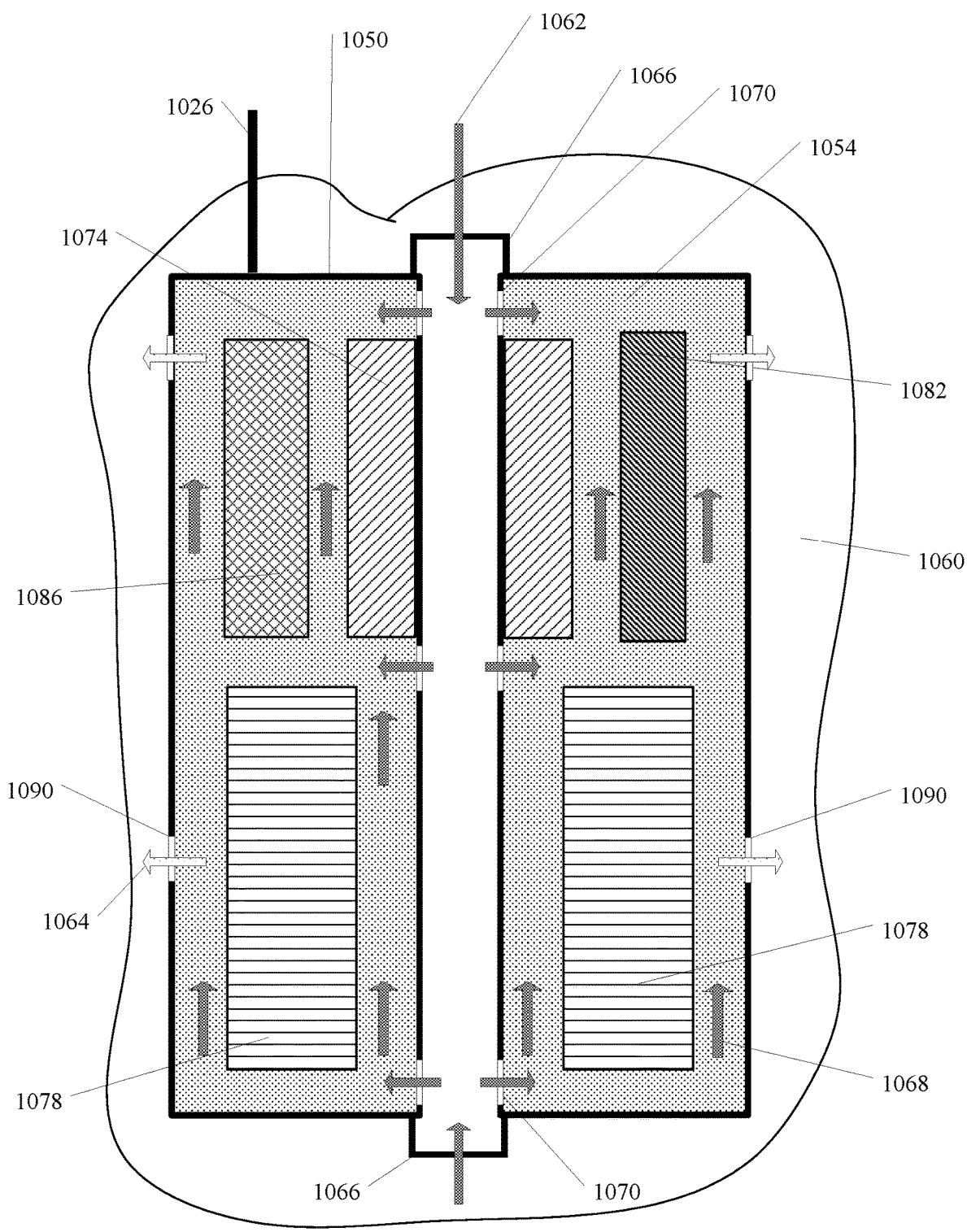
FIG. 10 shows a conceptual cross-section of an electronic device designed for subsurface installation that comprises electronic components that are cooled by interior channel and internal cooling fluid circulation according to an embodiment of the disclosed subject matter.

FIG. 10 shows a conceptual cross-section of an electronic device designed for subsurface installation that comprises electronic components that are cooled by interior channel and internal cooling fluid circulation. FIGS. 1, 2, 3, 4, 5, and/or 6 above refer to the electronic device of this section as an electronic device 116. This embodiment provides an enclosure 1050 for the electronic device, with a fluid filled interior space 1054, and an entry port for power, control and electrical signal cabling 1026. This embodiment has a pipe-like cylindrical or tubular enclosure of various cross-sectional geometries and lengths that allow the flow 1062 of cooling fluid 1060 through one or more channels in its central space, into the interior 1054 of the enclosure 1050, and flows 1068 around the interior electronic component assemblies. The exterior surface of the enclosure 1050 is in contact with a surrounding cooling fluid 1060. The enclosure 1050 has one or more upper and lower sealing caps 1066 through which the cooling fluid 1060 is forced 1062. The cooling fluid 1060 enters the interior space 1054 through one or more entry ports 1070; once inside the interior space 1054, the cooling fluid 1060 flows 1068 around the interior electronic component assemblies and is warmed by contact with the interior electronic component assemblies; the cooling fluid 1060 exits the enclosure 1064 through the exit ports 1090 into the containment vessel. The cooling fluid 1060 is circulated and cooled any of the manners described for FIGS. 1, 2, 3, 4, 5, and/or 6 above. Cooling fluid 1060 may optionally be circulated within or through enclosure 1050 by various devices including fluid circulators, fluid fans, and fluid pumps that are located internally or externally to enclosure 1050.

The electronic components interior to the enclosure 1050 include one or more power supplies 1074, one or more data storage assemblies 1078 comprising disk drives or other type of storage units, one or more motherboard assemblies 1082, and other custom electronic device assembly 1086 that may be required by a particular application. The motherboard assembly 1082, power supply assembly 1074, data storage assembly 1078, and custom electronic device assembly 1086 are electronic component assemblies that contain electronic components that have been arranged in a manner to facilitate proper operation and optimal heat transfer; each electronic component assembly 1082, 1074, 1078, 1086 is fully enclosed as a unit in order to either contain a secondary cooling fluid such as a dielectric or to isolate the electronic component assembly 1082, 1074, 1078, 1086 from direct contract with either the cooling fluid 1060 or another secondary cooling fluid. Each electronic component assembly 1082, 1074, 1078, 1086 will have cable entrances for power and electrical signaling that serve to interconnect the electronic component assemblies. Alternatively or additionally, each electronic component assembly 1082, 1074, 1078, 1086 could be mounted in a fashion to maximize the electronic component assembly 1082, 1074, 1078, 1086 contact with cooling fluid 1060 within enclosure 1050. Each electronic component assembly 1082, 1074, 1078, 1086 may be mounted in such a fashion as to transfer heat directly from the electronic component assembly 1082, 1074, 1078, 1086 to the wall of the enclosure 1050. The electronic component assemblies interior to the enclosure 1050 do not need to be arranged exactly as shown and may have various arrangements to facilitate heat transfer and operation. The circulation of the cooling fluid 1060 may be reversed by removing the warmed fluid from one or more channels in central space of the enclosure 1050 and introducing the cooled fluid into the enclosure 1050 via the exit ports 1090. Multiple enclosures 1050 may be connected in a single logical and/or physical structure as to form a single operating and/or installed unit.

Figure 11:
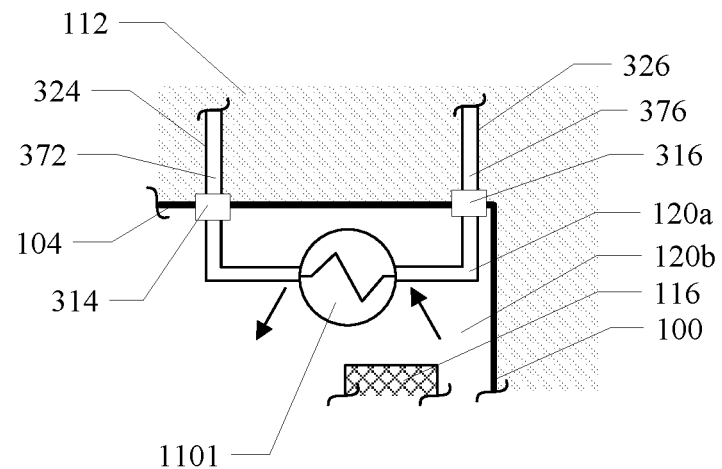
FIG. 11 shows an embodiment of indirect heat transfer using an internal heat exchanger.

FIG. 11 shows an embodiment of indirect heat transfer using an internal heat exchanger. FIG. 11 shows a configuration for heat transfer that may be optionally used in FIGS. 3, 4, 5 to effect indirect heat transfer from electronic devices 116 to a heat exchanger assembly installed external to, and either adjacent to or remote from, the containment vessel 100. FIG. 11 shows a portion of the diagrams in FIGS. 3, 4, 5 in order to illustrate the indirect cooling configuration. FIG. 11 shows an embodiment in which the cooling fluid 120 as designated in FIGS. 3, 4, 5 is segregated into two distinct portions designated 120a and 120b. Cooling fluid 120a circulates to one or more heat exchanger assemblies 1101 then to a heat exchanger assembly 356 as designated in FIGS. 3, 4, 5 installed external to, and either adjacent to or remote from, the containment vessel 100. Cooling fluid 120b partially or completely fills the interior volume of the containment vessel 100 and surrounds the electronic devices 116. Cooling fluid 120b circulates and/or performs in a manner as to effect the heat removal from the electronic devices 116. Cooling fluid 120b circulation may optionally assisted by one or more fluid circulators 132 as designated in FIG. 1, fluid pumps 210 as designated in FIG. 2, and/or fluid distributed piping and outlets 220, 326, 328, 428, 429 as designated in FIGS. 2, 3, 4. Heat from the warmer electronic devices 116 is transferred to the cooling fluid 120b. The cooling fluid 120b is warmed and is circulated and/or moves toward the upper region of the containment vessel 100. Heat exchanger assembly 1101 transfers heat from cooling fluid 120b to cooling fluid 120a. The warmer cooling fluid 120a, 372 passes through connecting line 324 that extends through fluid-tight connector assembly 314 and connects to one or more external adjacent or remote heat exchanger assemblies 356 and uses optional fluid pumps 322 as designated in FIGS. 3, 4, 5. The heat exchanger assembly 356 as designated in FIGS. 3, 4, 5 removes a portion of the heat from the warmer cooling fluid 120a, 372 and returns the resulting cooler cooling fluid 120a, 376 to the containment vessel 100 via connecting line 326 that extends through fluid-tight connector assembly 316 and connects to heat exchanger assembly 1101.

Although example diagrams to implement the elements of the disclosed subject matter have been provided, one skilled in the art, using this disclosure, could develop additional embodiments to practice the disclosed subject matter and each is intended to be included herein. Although many of the embodiments refer to a computer system or systems, this is merely exemplary and is not intended to limit the scope of this disclosure as the disclosed subject matter could be employed by someone skilled in the art, with the assistance of this disclosure, to cool any item which produces heat. Further, although discussed throughout as being positioned predominantly subsurface, one skilled in the art, with the assistance of this disclosure, could implement the teachings in a non-subsurface position. Finally, the embodiments disclosed could function without the need for traditional forced or passive air cooling.

In addition to the above described embodiments, those skilled in the art will appreciate that this disclosure has application in a variety of arts and situations and this disclosure is intended to include the same.

What is claimed is:

1. A system to cool electronic devices installed in a subsurface environment, the system comprising:
   a containment vessel comprising:
      a first thermally conductive fluid;
      a second thermally conductive fluid at least partially filling an interior space of said containment vessel;
      one or more electronic devices disposed within the interior space of said containment vessel, a number of the one or more electronic devices being in direct, indirect, or direct and indirect thermal contact with said second thermally conductive fluid to perform heat exchange between the number of the one or more electronic devices and to yield a heated said second thermally conductive fluid;
      a piping assembly configured to flow heated said first thermally conductive fluid from a second heat exchanger located internal to said containment vessel to a first heat exchanger located external to said containment vessel;
      said piping assembly configured to flow cooled said first thermally conductive fluid from said first heat exchanger to said second heat exchanger; and
      cabling which is extended from the interior space of said containment vessel to a location external to said containment vessel; and
   a heat exchanger circuit comprising:
      said first heat exchanger located external to said containment vessel, wherein said first heat exchanger is configured to receive heated said first thermally conductive fluid from said second heat exchanger, wherein said first heat exchanger is configured to perform a cooling operation on said first thermally conductive fluid, and wherein said first heat exchanger is in at least one location selected from the group of within subsurface environment and above subsurface environment;
      said second heat exchanger located internal to said containment vessel, wherein said second heat exchanger is configured to receive cooled said first thermally conductive fluid from said first heat exchanger and wherein said second heat exchanger is configured to perform a cooling operation on said second thermally conductive fluid;
      said piping assembly configured to flow heated said first thermally conductive fluid and wherein said piping assembly is configured to guide the flow of heated said first thermally conductive fluid from said second heat exchanger to said first heat exchanger; and
      said piping assembly configured to flow cooled said first thermally conductive fluid and wherein said piping assembly is configured to guide the flow of cooled said first thermally conductive fluid from said first heat exchanger to said second heat exchanger.

2. The system of claim 1, wherein the subsurface environment includes at least one of:
   a body of water;
   a borehole;
   an excavation;
   an underground structure; or
   any combination thereof.

3. The system of claim 2, wherein the body of water has a surface exposed to open air.

4. The system of claim 1, wherein the one or more electronic devices are grouped into one or more individual subsystems, wherein each of the subsystems are enclosed in individual cases or housings.

5. The system of claim 1, wherein said containment vessel is disposed completely in the subsurface environment.

6. The system of claim 1, wherein said containment vessel is not a human-inhabited space.

7. The system of claim 1, further comprising one or more circulating devices configured to circulate said second thermally conductive fluid within said containment vessel, wherein the one or more circulating devices include at least one of:
   a fluid circulator;
   a fluid pump;
   fluid distribution piping and outlets; or
   any combination thereof.

8. The system of claim 1, wherein said piping assembly is further configured to flow heated said first thermally conductive fluid from a second heat exchanger located internal to said containment vessel through an opening in said containment vessel to a first heat exchanger located external to said containment vessel.

9. The system of claim 8, wherein said piping assembly is further configured to flow cooled said first thermally conductive fluid from said first heat exchanger through said opening in said containment vessel to said second heat exchanger.

10. The system of claim 1, wherein said piping assembly is further configured to flow heated said first thermally conductive fluid from a second heat exchanger located internal to said containment vessel through a first opening in said containment vessel to a first heat exchanger located external to said containment vessel and said piping assembly is further configured to flow cooled said first thermally conductive fluid from said first heat exchanger through a second opening in said containment vessel to said second heat exchanger.

11. The system of claim 1, wherein said first heat exchanger is located remote from said containment vessel.

12. A method to cool electronic devices installed in a subsurface environment, the method comprising:
    containing electronic devices in a subsurface environment comprising a containment vessel:
        providing a first thermally conductive fluid;
        at least partially filling an interior space of said containment vessel with a second thermally conductive fluid;
        disposing one or more electronic devices within the interior space of said containment vessel, and thermally contacting a number of the one or more electronic devices directly, indirectly, or directly and indirectly with said second thermally conductive fluid to perform heat exchange between the number of the one or more electronic devices and to yield a heated said second thermally conductive fluid;
        configuring a piping assembly to flow heated said first thermally conductive fluid from a second heat exchanger located internal to said containment vessel to a first heat exchanger located external to said containment vessel;
        configuring said piping assembly to flow cooled said first thermally conductive fluid from said first heat exchanger to said second heat exchanger; and
        extending cabling from the interior space of said containment vessel to a location external to said containment vessel; and
    converting heated said first thermally conductive fluid into cooled said first thermally conductive fluid and converting heated said second thermally conductive fluid into cooled said second thermally conductive fluid using a heat exchanger circuit comprising the steps of:
        locating said first heat exchanger external to said containment vessel, wherein said first heat exchanger is configured to receive heated said first thermally conductive fluid from said second heat, wherein said first heat exchanger is configured to perform a cooling operation on said first thermally conductive fluid, and wherein said first heat exchanger is in at least one location selected from the group of within subsurface environment and above subsurface environment;
        locating said second heat exchanger internal to said containment vessel, wherein said second heat exchanger is configured to receive cooled said first thermally conductive fluid from said first heat exchanger and wherein said second heat exchanger is configured to perform a cooling operation on said second thermally conductive fluid;
        configuring said piping assembly to flow heated said first thermally conductive fluid and wherein said pipe assembly is configured to guide the flow of heated said first thermally conductive fluid from said second heat exchanger to said first heat exchanger; and
        configuring said piping assembly to flow cooled said first thermally conductive fluid and wherein said pipe assembly is configured to guide the flow of cooled said first thermally conductive fluid from said first heat exchanger to said second heat exchanger.

13. The method of claim 12, wherein the subsurface environment includes at least one of:
    a body of water;
    a borehole;
    an excavation;
    an underground structure; or
    any combination thereof.

14. The method of claim 13, wherein the body of water has a surface exposed to open air.

15. The method of claim 12, wherein the one or more electronic devices are grouped into one or more individual subsystems, wherein each of the subsystems are enclosed in individual cases or housings.

16. The method of claim 12, wherein said containment vessel is disposed completely in the subsurface environment.

17. The method of claim 12, wherein said containment vessel is not a human-inhabited space.

18. The method of claim 12, further comprising one or more circulating devices configured to circulate said second thermally conductive fluid within said containment vessel, wherein the one or more circulating devices include at least one of:
    a fluid circulator;
    a fluid pump;
    fluid distribution piping and outlets; or
    any combination thereof.

19. The method of claim 12, further configuring said piping assembly to flow heated said first thermally conductive fluid from a second heat exchanger located internal to said containment vessel through an opening in said containment vessel to a first heat exchanger located external to said containment vessel.

20. The method of claim 19, furthering configuring said piping assembly to flow cooled said first thermally conductive fluid from said first heat exchanger through said opening in said containment vessel to said second heat exchanger.

21. The method of claim 12, further configuring said piping assembly to flow heated said first thermally conductive fluid from a second heat exchanger located internal to said containment vessel through a first opening in said containment vessel to a first heat exchanger located external to said containment vessel and furthering configuring said piping assembly to flow cooled said first thermally conductive fluid from said first heat exchanger through a second opening in said containment vessel to said second heat exchanger.

22. The method of claim 12, wherein said first heat exchanger is located remote from said containment vessel.

* * * * *